United States Patent
Kobayashi

(10) Patent No.: US 7,874,534 B2
(45) Date of Patent: Jan. 25, 2011

(54) CIRCUIT BOARD MOUNTING BACKPLATE

(75) Inventor: Tatsuyoshi Kobayashi, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 219 days.

(21) Appl. No.: 11/873,554

(22) Filed: Oct. 17, 2007

(65) Prior Publication Data

US 2008/0290229 A1    Nov. 27, 2008

(30) Foreign Application Priority Data

Oct. 18, 2006    (JP) ............... 2006-284169

(51) Int. Cl.
*A47F 5/00* (2006.01)
(52) U.S. Cl. ............... 248/300; 248/225.11
(58) Field of Classification Search ............... 248/300, 248/220.21, 223.41, 224.8, 225.11, 309.1, 248/316.7
See application file for complete search history.

(56) References Cited

U.S. PATENT DOCUMENTS

| 1,676,485 A | * | 7/1928 | Finucane | 248/74.5 |
| 5,451,023 A | * | 9/1995 | Johnston | 248/316.7 |
| 7,178,776 B2 | * | 2/2007 | Buck et al. | 248/300 |
| 2003/0116685 A1 | * | 6/2003 | Jensen | 248/200 |
| 2006/0157626 A1 | * | 7/2006 | Wooten | 248/248 |

FOREIGN PATENT DOCUMENTS

| JP | 62-189797 A | 8/1987 |
| JP | 5-259603 A | 10/1993 |

* cited by examiner

*Primary Examiner*—Ramon O Ramirez
(74) *Attorney, Agent, or Firm*—Crowell & Moring LLP

(57) ABSTRACT

Disclosed is a circuit board mounting backplate to mount a circuit board including a base unit, a tongue unit formed by bending a region enclosed by a notched groove formed at a portion of the base unit and a horizontal unit formed by bending the tongue unit at a predetermined height position so as to be horizontal to the base unit, and burring holes are provided at the horizontal unit and the base unit, respectively, so that center positions of the burring holes are arranged at a same position and that a diameter of the burring hole provided at the horizontal unit is larger than a diameter of the burring hole of the base unit, and the circuit board is mounted on the horizontal unit and/or the base unit.

4 Claims, 2 Drawing Sheets

CIRCUIT BOARD MOUNTING BACKPLATE

BACKGROUND OF THE INVENTION

1. Field of the Invention

The present invention relates to a circuit board mounting backplate for mounting a circuit board.

2. Description of the Related Art

Conventionally, concerning the mounting of a circuit board to a backplate product, a new metallic mold of the backplate product was made according to the height of the mounting position of the circuit board when the height of the mounting position is changed or when a plurality of circuit boards are mounted at predetermined intervals.

Further, there is known a printed wired board supporting member which can arrange a plurality of printed wired boards in a stacking manner at predetermined intervals by screwing one end part of a supporting body shaped in a shaft-form to a chassis, and by arranging one of the printed circuit board at the other end part of the supporting body and arranging the other printed wired boards at a stepped portion which is provided between the one end part and the other end part of the supporting body (see, JP5-259603A).

Moreover, there is known a printed board mounting device in which a plurality of printed boards are fixed at predetermined intervals by providing clasps having approximately the same height as the space between the adjacent two printed boards at both ends of the two printed boards (see JP62-189797A).

However, when arranging a plurality of printed boards at the chassis or the like in a stacking manner or when changing the height of the fixed position of the printed board as described in the above mentioned conventional art, there is a problem that the printed board mounting device is costly because predetermined supporting members and clasps are needed.

SUMMARY OF THE INVENTION

It is, therefore, a main object of the present invention to provide a circuit board mounting backplate which can change the height of the mounting position of the circuit board at low cost.

According to a first aspect of the present invention, there is provided a circuit board mounting backplate to mount a circuit board comprising a base unit, a tongue unit formed by bending a region enclosed by a notched groove formed at a portion of the base unit and a horizontal unit formed by bending the tongue unit at a predetermined height position so as to be horizontal to the base unit, and burring holes are provided at the horizontal unit and the base unit, respectively, so that center positions of the burring holes are arranged at a same position and that a diameter of the burring hole provided at the horizontal unit is larger than a diameter of the burring hole of the base unit, and the circuit board is mounted on the horizontal unit and/or the base unit.

According to a second aspect of the present invention, there is provided a circuit board mounting backplate to mount a circuit board comprising a base unit, a tongue unit formed by bending a region enclosed by a notched groove formed at a portion of the base unit and a horizontal unit formed by bending the tongue unit at a predetermined height position so as to form one step or a plurality of steps horizontally to the base unit, and screw holes are provided at the horizontal unit and the base unit respectively, and the circuit board is mounted on the horizontal unit and/or the base unit.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIG. 1A is a perspective view showing a case where a circuit board is mounted on a base unit, and FIG. 1B is a cross-sectional view showing a state where the circuit board is screwed on the line A-A of FIG. 1A; FIG. 2A is a perspective view showing a case where the circuit board is mounted on a horizontal unit, and FIG. 2B is a cross-sectional view showing a state where the circuit board is screwed on the line B-B of FIG. 2A.

PREFERRED EMBODIMENT OF THE INVENTION

Hereinafter, a specific embodiment of the circuit board mounting backplate according to the present invention will be described with reference to the drawings.

The circuit board mounting backplate of the present invention is made of aluminum alloy plate, steel plate or the like, and for example, the circuit board mounting backplate comprises a base unit 10, a tongue unit 20 which is formed by bending the region enclosed by a notched groove formed in an approximately U-shape in a plan view at a portion of the base unit 10 so as to be approximately vertical to the base unit 10, and a horizontal unit 21 formed by bending the tongue unit 20, as shown in FIG. 1.

Figure 1A:
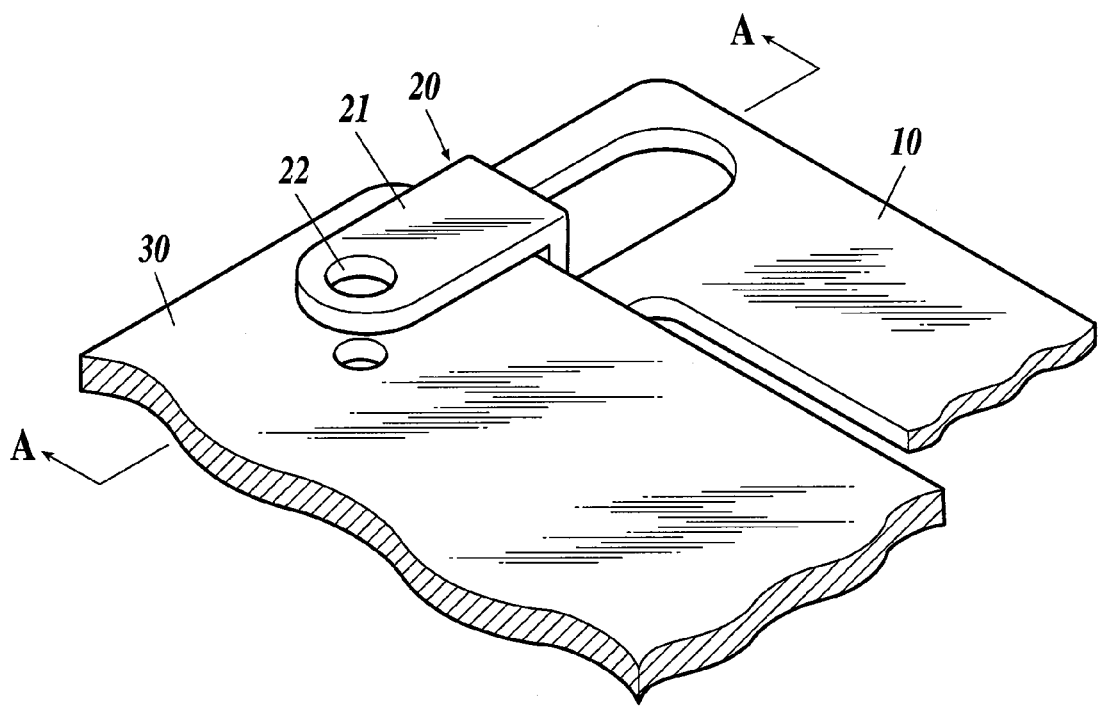
FIG. 1A and FIG. 1B are views showing a circuit board mounting backplate according to the present invention.
Figure 1B:
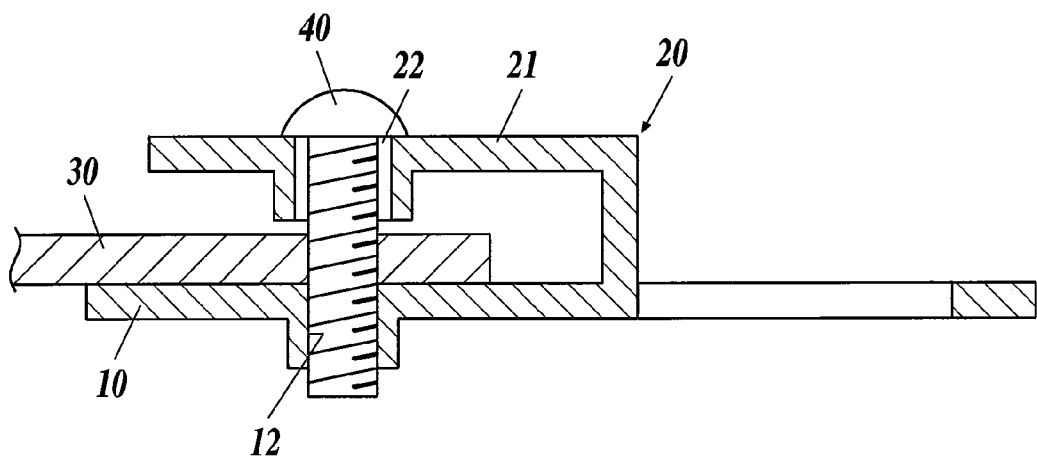

The base unit 10 is formed in a plate-like shape for mounding the circuit board 30. As shown in FIGS. 1A and 1B, a burring hole 12 for mounting the circuit board 30 by a screw 40 is provided at a predetermined position of the base unit 10. Further, the notched groove formed in an approximately U-shape in a plan view is formed at a portion of the base unit 10 by punching to form an after-mentioned horizontal unit 21.

Figure 2A:
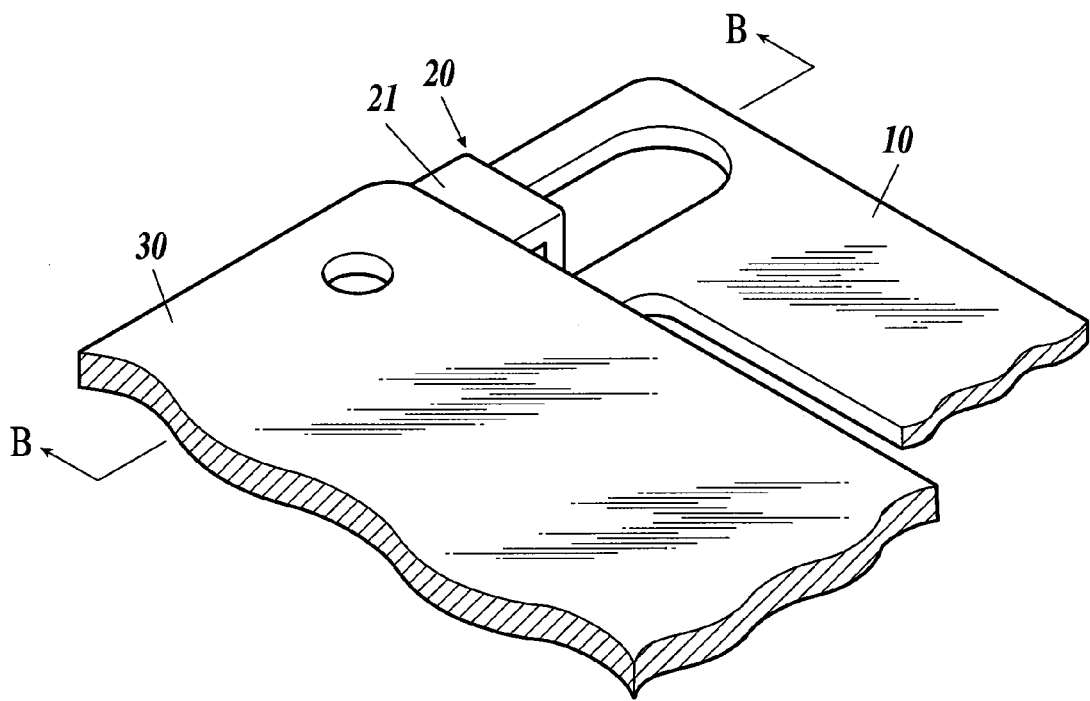
FIG. 2A and FIG. 2B are views showing the circuit board mounting backplate according to the present invention.
Figure 2B:
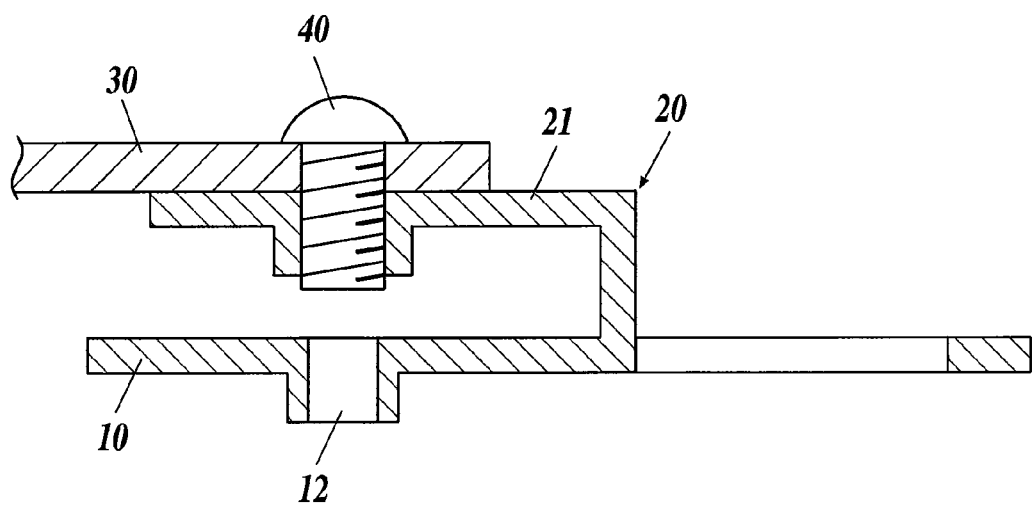

As shown in FIGS. 1A and 1B, the horizontal unit 21 is formed by bending the tongue unit 20 in an approximately sectional U-shape so as to be horizontal to the base unit 10 at a predetermined height position. Further, at a predetermined position of the horizontal unit 21, a burring hole 22 for mounting the circuit board 30 by the screw 40 is provided. Thereby, the circuit board 30 can be mounted on the horizontal unit 21 by being threaded by the screw 40 as shown in FIG. 2B.

Here, the center position of the hole of the burring hole 22 is arranged so as to be at the same position as the center position of the hole of the burring hole 12 which is provided at the base unit 10. Further, the diameter of the burring hole 22 at the horizontal unit 21 is provided so as to be larger than the diameter of the burring hole 12 at the base unit 10.

As described above, according to the construction of the backplate of the present invention, the horizontal unit 21 is formed by bending the tongue unit 20 which is formed at a portion of the base unit 10 so as to be horizontal to the base unit 10 at the predetermined height position, and the circuit board 30 can be attached via the burring hole 22 and/or 12 which is provided at the horizontal unit 21 and/or the base unit 10. Thereby, the height of the position to which the circuit board is attached can be changed at low cost.

Moreover, when the circuit boards 30 are mounted on the horizontal unit 21 and the base unit 10, respectively, the circuit boards 30 can be simultaneously fixed by one screw 40 by arranging the center positions of the burring hole 22 provided at the horizontal unit 21 and the burring hole 12 provided at the base unit 10 at the same position. Therefore, the work efficiency can be improved.

Moreover, when the circuit board 30 is mounted on the base unit 10, the screw 40 can be inserted in the burring hole 22 at the horizontal unit 21 smoothly by forming the diameter of the burring hole 22 provided at the horizontal unit 21 so as to be larger than the diameter of the burring hole 12 provided at the base unit 10. Therefore, the work efficiency can be improved.

Furthermore, the circuit board can be mounted on the horizontal unit and/or the base unit more rigidly by forming the screw hole as the burring hole.

The present invention is not limited to the above described embodiment. The shape or the like of the circuit board mounting backplate is arbitrary, and may be formed in a preferable size and shape according to the specification or the like of the circuit board to be mounted on the circuit board mounting backplate.

Concerning the tongue unit 20, the shape is not limited to the approximately U-shape in plan view as shown in FIGS. 1A, 1B, 2A and 2B, and may be formed in a preferable size and shape according to the specification or the like of the circuit board.

Further, concerning the horizontal unit 21, the number of steps is not limited to one step as shown in FIGS. 1A, 1B, 2A and 2B. The circuit board mounting backplate may be designed to include a vertical unit which is formed by bending a portion of the horizontal unit 21 so as to be vertical to the base unit 10 and the second horizontal unit which is formed by bending the vertical unit so as to be horizontal to the base unit 10. Further, the circuit board mounting backplate may include a plurality of horizontal units such as the third, the fourth, . . . by bending the second horizontal unit.

Furthermore, concerning other specific detail structures or the like, it is needless to say that they can be arbitrarily modified.

According to a first aspect of the preferred embodiment of the present invention, a circuit board mounting backplate to mount a circuit board comprises a base unit, a tongue unit formed by bending a region enclosed by a notched groove formed at a portion of the base unit and a horizontal unit formed by bending the tongue unit at a predetermined height position so as to be horizontal to the base unit, and burring holes are provided at the horizontal unit and the base unit, respectively, so that center positions of the burring holes are arranged at a same position and that a diameter of the burring hole provided at the horizontal unit is larger than a diameter of the burring hole of the base unit, and the circuit board is mounted on the horizontal unit and/or the base unit.

In accordance with the first aspect of the preferred embodiment of the present invention, the horizontal unit is formed by further bending the tongue unit, formed by bending the region enclosed by the notched groove formed at a portion of the base unit, so as to be horizontal to the base unit at the predetermined height position, and the circuit board is mounted via the burring holes provided at the horizontal unit and/or the base unit. Therefore, the height of the mounting position of the circuit board can be changed at low cost.

Further, when two circuit boards are respectively mounted on the horizontal unit and the base unit, the two circuit boards can be fixed simultaneously by one screw by arranging the center positions of the burring hole provided at the horizontal unit and the burring hole provided at the base unit at the same position. Therefore, the work efficiency can be improved.

When the circuit board is mounted on the base unit, the screw can be inserted in the burring hole at the horizontal unit smoothly by forming the diameter of the burring hole provided at the horizontal unit so as to be larger than the diameter of the burring hole provided at the base unit. Therefore, the work efficiency can be improved.

Moreover, the circuit board can be mounted on the horizontal unit and/or the base unit more rigidly by forming the screw hole as the burring hole.

According to a second aspect of the preferred embodiments of the present invention, a circuit board mounting backplate to mount a circuit board comprises a base unit, a tongue unit formed by bending a region enclosed by a notched groove formed at a portion of the base unit and a horizontal unit formed by bending the tongue unit at a predetermined height position so as to form one step or a plurality of steps horizontally to the base unit, and screw holes are provided at the horizontal unit and the base unit respectively, and the circuit board is mounted on the horizontal unit and/or the base unit.

In accordance with the second aspect of the preferred embodiment of the present invention, the horizontal unit is formed by further bending the tongue unit, formed by bending the region enclosed by the notched groove formed at a portion of the base unit, in one step or a plurality of steps so as to be horizontal to the base unit at a predetermined height position, and the circuit board is mounted via the screw hole provided at the horizontal unit and/or the base unit. Thereby, the height of the position to which the circuit board is attached can be changed at low cost.

Preferably, center positions of the screw hole provided at the horizontal unit and the screw hole provided at the base unit are arranged at a same position.

In the present invention, the same effect is obtained. Further, when two circuit boards are mounted on the horizontal unit and the base unit, respectively, the circuit boards can be simultaneously fixed by one screw by arranging the center positions of the screw hole provided at the horizontal unit and the screw hole provided at the base unit at the same position. Therefore, the work efficiency can be improved.

Preferably, a diameter of the screw hole provided at the horizontal unit is larger than a diameter of the screw hole provided at the base unit.

In the present invention, the same effect is obtained. Further, when the circuit board is mounted on the base unit, the screw can be inserted in the screw hole at the horizontal unit smoothly by forming the diameter of the screw hole provided at the horizontal unit so as to be larger than the diameter of the screw hole provided at the base unit. Therefore, the work efficiency can be improved.

The entire disclosure of Japanese Patent Application No. 2006-284169 filed on Oct. 18, 2006 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A circuit board mounting backplate to mount a circuit board, comprising:
   a base unit having a first burring hole;
   a tongue unit formed between an opening produced by bending a region of the base unit to form the tongue unit; and
   a horizontal unit formed by bending a part of the tongue unit at a predetermined height position so as to be horizontal to the base unit, the horizontal unit having a second burring hole with a center position thereof being arranged at the same position as that of the first burring hole, a diameter of the second burring hole being larger than a diameter of the first burring hole; and
   wherein the circuit board is mountable on the horizontal unit and/or the base unit to be fixable thereon with a screw screwed in at least one of the first burring hole and the second burring hole.

2. A circuit board mounting backplate to mount a circuit board, comprising:
   a base unit having a first burring hole;
   a tongue unit formed between an opening produced by bending a region of the base unit to form the tongue unit; and
   at least one horizontal unit formed by bending a part of the tongue unit at a predetermined height position so as to be horizontal relative to the base unit, the horizontal unit having a second burring hole;
   wherein the circuit board is mountable on the horizontal unit and/or the base unit to be fixable thereon with a screw screwed in at least one of the first burring hole and the second burring hole.

3. The circuit board mounting backplate as claimed in claim 2, wherein center positions of the first burring hole and the second burring hole are arranged at a same position.

4. The circuit board mounting backplate as claimed in claim 3, wherein a diameter of the second burring hole is larger than a diameter of the first burring hole.

* * * * *